United States Patent
AlGwaiz

(10) Patent No.: US 11,867,191 B2
(45) Date of Patent: Jan. 9, 2024

(54) AERODYNAMIC ANTI-ROTATION DEVICE

(71) Applicant: Saudi Arabian Oil Company, Dhahran (SA)

(72) Inventor: Abdulrahman Abdulaziz AlGwaiz, Riyadh (SA)

(73) Assignee: Saudi Arabian Oil Company, Dhahran (SA)

( * ) Notice: Subject to any disclaimer, the term of this patent is extended or adjusted under 35 U.S.C. 154(b) by 211 days.

(21) Appl. No.: 16/528,881

(22) Filed: Aug. 1, 2019

(65) Prior Publication Data
US 2021/0033099 A1  Feb. 4, 2021

(51) Int. Cl.
| | |
|---|---|
| *F04D 27/00* | (2006.01) |
| *F04D 19/00* | (2006.01) |
| *F04D 25/08* | (2006.01) |
| *F04D 29/32* | (2006.01) |
| *H05K 7/20* | (2006.01) |

(52) U.S. Cl.
CPC ......... *F04D 27/008* (2013.01); *F04D 19/005* (2013.01); *F04D 25/08* (2013.01); *F04D 29/329* (2013.01); *H05K 7/20172* (2013.01)

(58) Field of Classification Search
CPC ...... F04D 27/008; F04D 19/005; F04D 25/08; F04D 29/329; F04D 19/002; H05K 7/20172
See application file for complete search history.

(56) References Cited

U.S. PATENT DOCUMENTS

| | | | | |
|---|---|---|---|---|
| 2,027,662 A | * | 1/1936 | Young | F04D 25/105 416/32 |
| 4,647,801 A | | 3/1987 | Swartwout | |
| 5,921,753 A | * | 7/1999 | Ames | F04D 19/002 416/169 R |
| 6,016,716 A | * | 1/2000 | Mauro | F16H 1/16 24/456 |

(Continued)

FOREIGN PATENT DOCUMENTS

JP  2002235934 A  8/2002

OTHER PUBLICATIONS

International Search Report & Written Opinion for International Application No. PCT/US2020/044466, dated Oct. 16, 2020; pp. 1-8.

*Primary Examiner* — Charles G Freay
*Assistant Examiner* — Lilya Pekarskaya
(74) *Attorney, Agent, or Firm* — Bracewell LLP; Constance G. Rhebergen; Keith R. Derrington

(57) ABSTRACT

An anti-rotation device configured to prevent a plurality of blades of the industrial fan from rotating. The anti-rotation device includes a movable member and a non-movable member, wherein the movable member is slidable relative to the blades between two positions, an unlocked position that substantially permits the plurality of blades to rotate and a locked position that substantially prevents the plurality of blades from rotating. The movable member is movable in a direction substantially perpendicular to a direction of rotation of the blades. In one embodiment, the anti-rotation device includes a substantially L-shaped lever having a long side and a short side, a pulley operatively connected to the L-shaped lever at a point where the long side and the short side meet, and a substantially flat plate attached to one end of the short side of the L-shaped lever.

7 Claims, 6 Drawing Sheets

(56) References Cited

U.S. PATENT DOCUMENTS

| | | | | |
|---|---|---|---|---|
| 6,022,193 | A * | 2/2000 | Dubois | B63B 22/003 |
| | | | | 416/169 R |
| 6,145,785 | A * | 11/2000 | Certain | B64C 27/001 |
| | | | | 244/17.11 |
| 6,422,814 | B1 * | 7/2002 | Dickey | F04D 25/0613 |
| | | | | 415/123 |
| 7,025,086 | B2 | 4/2006 | Maeda et al. | |
| 7,219,775 | B2 | 5/2007 | Zalinski | |
| 7,306,426 | B2 | 12/2007 | Franz et al. | |
| 7,796,386 | B2 | 9/2010 | Chou | |
| 8,979,506 | B2 * | 3/2015 | Kabir | F04D 27/0292 |
| | | | | 417/214 |
| 9,188,130 | B2 | 11/2015 | Johnson | |
| 10,890,219 | B2 * | 1/2021 | Innes | G06F 1/20 |
| 2005/0186071 | A1 * | 8/2005 | Franz | F04D 27/008 |
| | | | | 415/220 |
| 2008/0242212 | A1 * | 10/2008 | El-Galley | F24F 1/00075 |
| | | | | 454/258 |
| 2009/0014607 | A1 * | 1/2009 | Schwarze | A61B 17/2255 |
| | | | | 248/176.1 |
| 2019/0093716 | A1 * | 3/2019 | Innes | G06F 1/20 |

* cited by examiner

AERODYNAMIC ANTI-ROTATION DEVICE

BACKGROUND

1. Technical Field

Embodiments relate generally to devices for preventing reverse rotation of industrial fans. More specifically, embodiments relate to an aerodynamic anti-rotation device for preventing "wind-milling" in fans.

2. Description of Related Art

There is a requirement in many cases for a shaft which is mounted on bearings to have a device attached to the shaft which prevents reverse rotation of the shaft. This is particularly required in regard to the shaft for carrying a fan since the fan has a tendency to rotate in the reverse direction when there is no drive to the motor due to reverse air flow through the fan. When the air flow is particularly strong, a significant reverse rotation can be obtained which can lead to damage of the motor and/or motor drive components when the motor is started for rotating the fan in the required drive direction.

SUMMARY

Accordingly, one embodiment is an industrial fan locking mechanism. The industrial fan locking mechanism includes an anti-rotation device configured to prevent a plurality of blades of the industrial fan from rotating. The anti-rotation device includes a movable member and a non-movable member. The movable member is slidable relative to the blades between two positions, an unlocked position that substantially permits the plurality of blades to rotate and a locked position that substantially prevents the plurality of blades from rotating. The movable member is movable in a direction substantially perpendicular to a direction of rotation of the blades.

Another example embodiment is aerodynamic anti-rotation device including a substantially L-shaped lever having a long side and a short side, a pulley operatively connected to the L-shaped lever at a point where the long side and the short side meet, and a substantially flat plate attached to one end of the short side of the L-shaped lever. The pulley includes a wheel on an axle or shaft configured to support movement of the L-shaped lever.

Another example embodiment is an industrial fan assembly including a central hub, a plurality of blades operatively connected to and configured to rotate around the central hub, and an anti-rotation device configured to prevent the plurality of blades from rotating. The anti-rotation device includes a movable member and a non-movable member. The movable member is slidable relative to the blades between two positions, an unlocked position that substantially permits the plurality of blades to rotate and a locked position that substantially prevents the plurality of blades from rotating. The movable member is movable in a direction substantially perpendicular to a direction of rotation of the blades or in a radial direction relative to the central hub.

One embodiment relates to industrial forced draft cooling fans including contactless aero dynamic anti-rotation pin instead of the conventional mechanical rotary anti rotation pin. All industrial plants have air cooled fans and all fans need a locking device to lock the fan from reverse rotation during off position. As a result, it requires mechanical anti rotation pin. However, all mechanical anti rotation pins in the market today are assembled with the fan shaft or gearbox. It is subject to rotation, wear, vibration and potential failures. Also, retrofitting is costly because it is part of the fan rotor and not independent.

An advantage of the aero dynamic anti-rotation pin is that when the fan starts, the pin utilizes airflow to dis-engage with the fan, and allow fan to rotate freely. When the fan stops, there is no airflow and the aero dynamic anti-rotation pin returns to lock position using gravity, which prevents the fan from reverse rotation. The aero dynamic anti-rotation pin is independent from the fan, and not part of the fan rotor. The absence of anti-rotation pin can cause coupling failures, gearbox failure, belt failures and motor failures.

BRIEF DESCRIPTION OF DRAWINGS

The foregoing aspects, features, and advantages of embodiments of the present disclosure will further be appreciated when considered with reference to the following description of embodiments and accompanying drawings. In describing embodiments of the disclosure illustrated in the appended drawings, specific terminology will be used for the sake of clarity. However, the disclosure is not intended to be limited to the specific terms used, and it is to be understood that each specific term includes equivalents that operate in a similar manner to accomplish a similar purpose.

For simplicity and clarity of illustration, the drawing figures illustrate the general manner of construction, and descriptions and details of well-known features and techniques may be omitted to avoid unnecessarily obscuring the discussion of the described embodiments. Additionally, elements in the drawing figures are not necessarily drawn to scale. For example, the dimensions of some of the elements in the figures may be exaggerated relative to other elements to help improve understanding of the embodiments. Like reference numerals refer to like elements throughout the specification.

DETAILED DESCRIPTION

The methods and systems of the present disclosure will now be described with reference to the accompanying drawings in which embodiments are shown. The methods and systems of the present disclosure may be in many different forms and should not be construed as limited to the illustrated embodiments set forth here; rather, these embodiments are provided so that this disclosure will be thorough and complete, and will fully convey its scope to those skilled in the art.

Figure 1A:
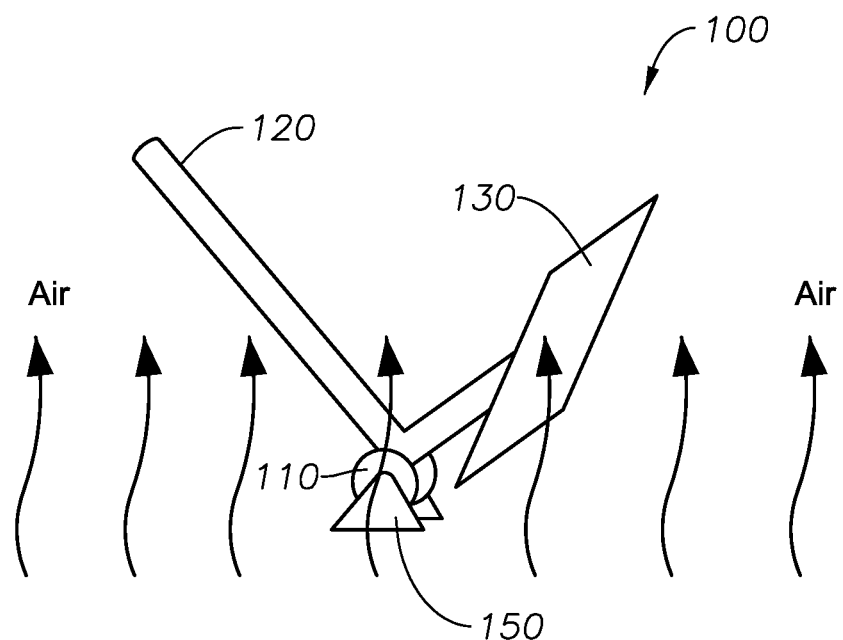
FIGS. 1A-B illustrates unlocked and locked positions of an anti-rotation device, according to one or more example embodiments.
Figure 1B:
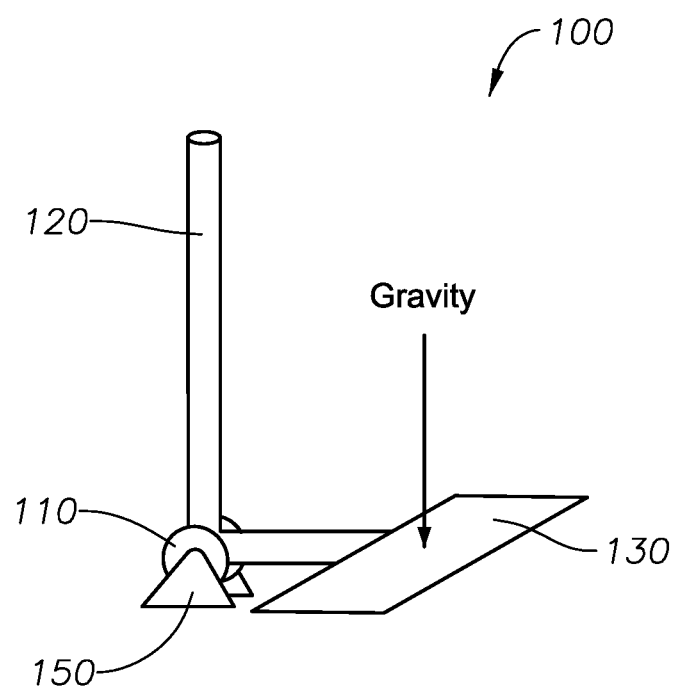

Turning now to the figures, FIG. 1A illustrates an unlocked position of an anti-rotation device 100, according to one or more example embodiments. The aerodynamic anti-rotation device 100 includes a substantially L-shaped lever 120 having a long side and a short side. The device 100 also includes a pulley 110 operatively connected to the L-shaped lever 120 at a point where the long side and the short side meet. The device 100 also includes a substantially flat plate 130 attached to one end of the short side of the L-shaped lever 120. The pulley 110 includes a wheel on an axle or shaft configured to support movement of the L-shaped lever 120, and may be mounted using a bracket 150. FIG. 1B illustrates a locked position of the anti-rotation device 100, the operation of which will be explained in further detail with reference to FIGS. 2A-B.

Figure 2A:
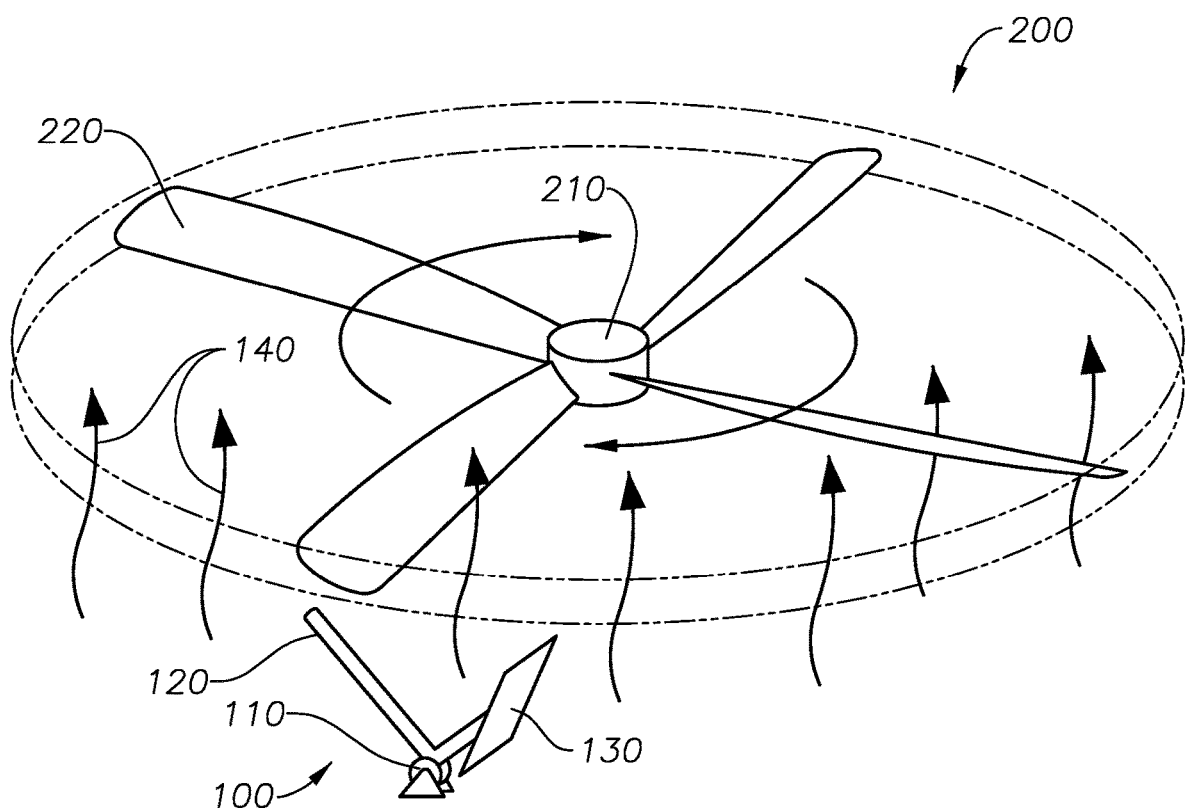
FIGS. 2A-B illustrates unlocked and locked positions of a fan assembly including an anti-rotation device, according to one or more example embodiments.
Figure 2B:
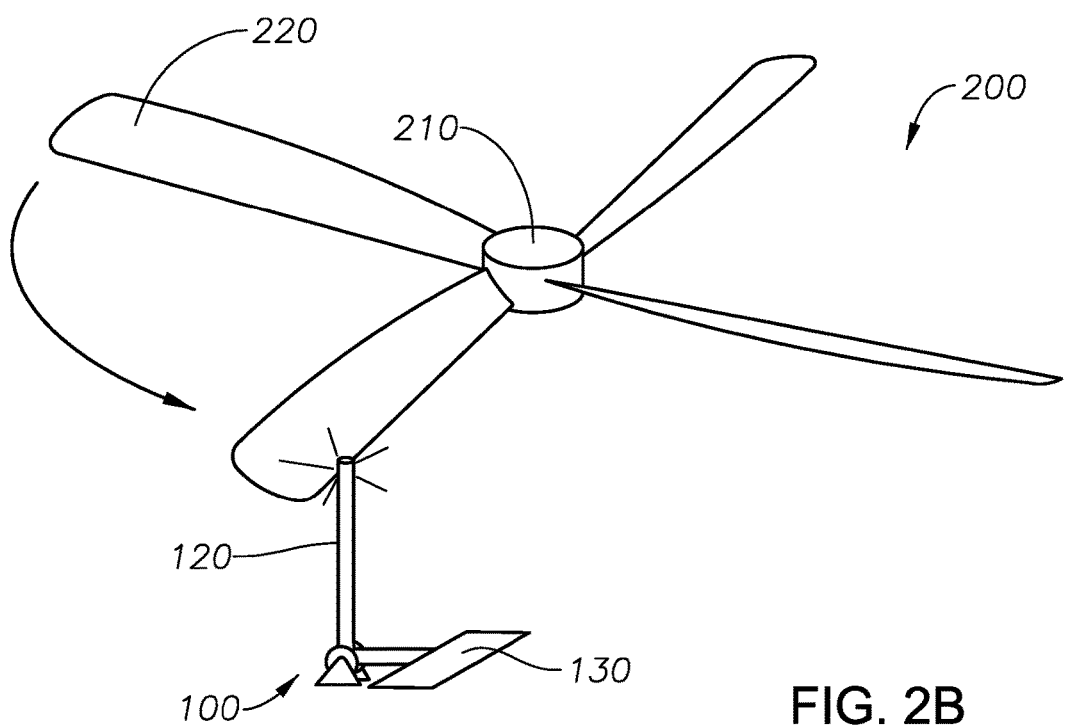

FIGS. 2A-B illustrates unlocked and locked positions of a fan assembly 200 including an anti-rotation device 100, according to one or more example embodiments. The industrial fan assembly may include a central hub 210, a plurality of blades 220 operatively connected to and configured to rotate around the central hub 210, and an anti-rotation device 100 that is configured to prevent the plurality of blades 220 from rotating. The anti-rotation device 100 includes a movable member or substantially L-shaped lever 120 and a non-movable member 110. The movable member or substantially L-shaped lever 120 is slidable relative to the blades 220 between two positions, an unlocked position that substantially permits the plurality of blades 220 to rotate and a locked position that substantially prevents the plurality of blades 220 from rotating. The movable member or substantially L-shaped lever 120 is movable in a direction substantially perpendicular to a direction of rotation of the blades 220 or in a radial direction relative to the central hub 210. The fan assembly can also include an electric motor that can be operatively connected to the central hub 210 for powering the plurality of blades 220. Alternatively, a transmission unit such as a gearbox or a pulley and belt may be used to provide power to the central hub 210.

Turning now to FIG. 2A, when the fan is ON, the forward movement of the blades 220 disengages the substantially L-shaped lever 120, and the airflow 140 generated by the blades 220 of the fan lifts the substantially flat plate 130 upwards. However, when the fan is OFF, the airflow 140 from the fan gradually stops and the weight of the substantially flat plate 130 pulls the plate downwards due to gravity, thereby engaging the substantially L-shaped lever 120 with the blades 220 of the fan and locking reverse movement of the blades, as illustrated in FIG. 2B.

The weight of the substantially L-shaped lever 120 or the distribution thereof may be based on an airflow of the fan in cubic feet per minute. Similarly, the weight of the substantially flat plate 130 or the distribution thereof may be based on an airflow of the fan in cubic feet per minute. For example, for fans with higher airflow, a heavier lever or heavier plate may be required. Similarly, for fans with lower airflow, a lighter lever or lighter plate may be required. Additionally, the dimensions of the substantially L-shaped lever 120 and the substantially flat plate 130 may also be based on an airflow of the fan in cubic feet per minute. For example, for fans with higher airflow, a larger lever or larger plate may be required. Similarly, for fans with lower airflow, a smaller lever or smaller plate may be required. Although a substantially rectangular plate is illustrated in the figures, any shape plate may be used in the aerodynamic anti-rotation device, including but not limited to square, oval, and one with curved edges.

Figure 3A:
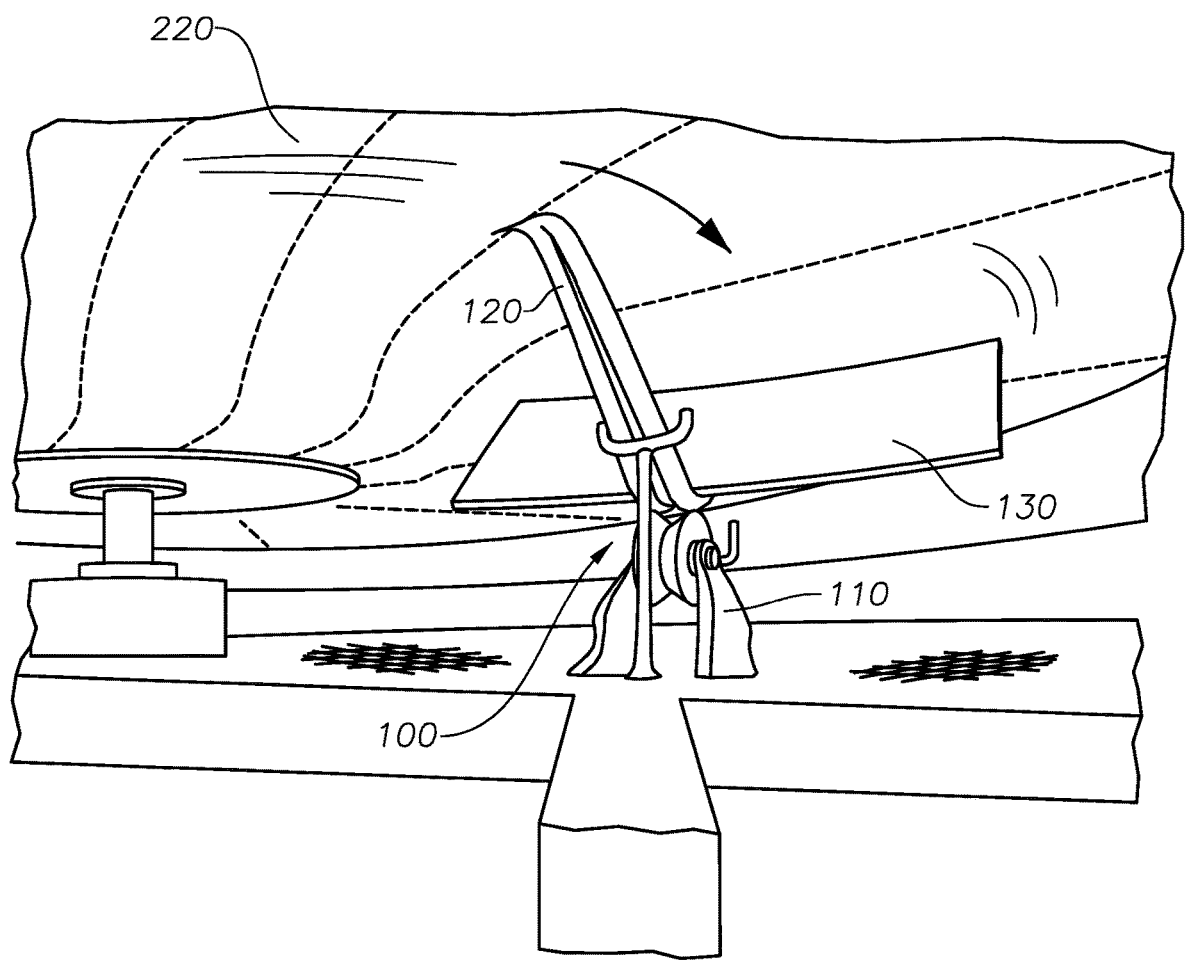
FIG. 3A illustrates an example fan assembly including an anti-rotation device in an unlocked position, according to one or more example embodiments.

FIG. 3A is a photograph of a fan assembly including an anti-rotation device 100 in an unlocked position, according to one or more example embodiments. The anti-rotation device 100 is configured to prevent a plurality of blades of the industrial fan from rotating. The anti-rotation device 100 includes a movable member or substantially L-shaped lever 120 and a non-movable member 110. The movable member or substantially L-shaped lever 120 is slidable relative to the blades 220 between two positions, an unlocked position that substantially permits the plurality of blades 220 to rotate and a locked position that substantially prevents the plurality of blades 220 from rotating. The movable member or substantially L-shaped lever 120 is movable in a direction substantially perpendicular to a direction of rotation of the blades.

When the fan is ON, the forward movement of the blades 220 disengages the substantially L-shaped lever 120, and the airflow generated by the blades 220 of the fan lifts the substantially flat plate 130 upwards. However, when the fan is OFF, the airflow from the fan gradually stops and the weight of the substantially flat plate 130 pulls the plate downwards due to gravity, thereby engaging the substantially L-shaped lever 120 with the blades 220 of the fan and locking reverse movement of the blades.

Figure 3B:
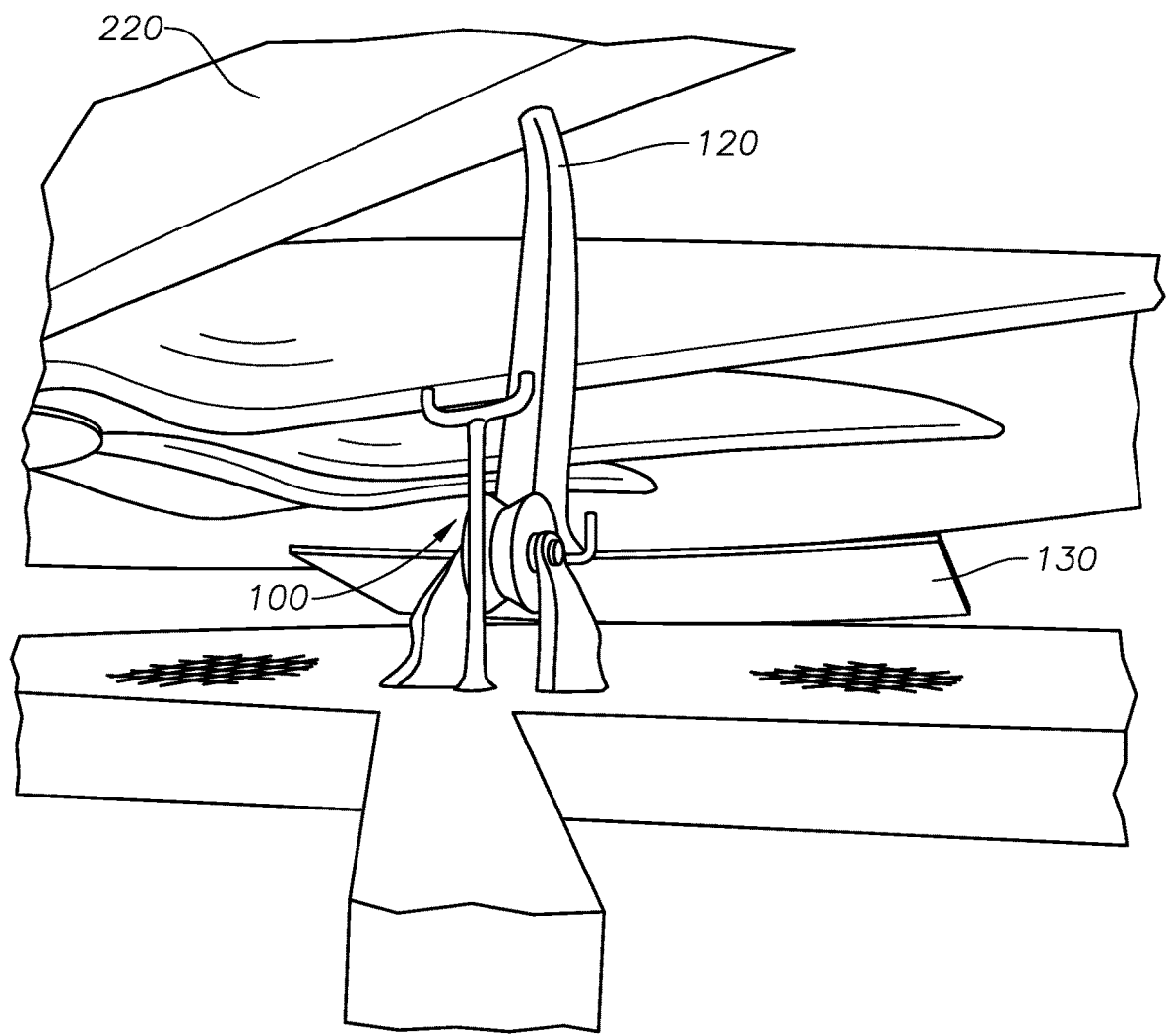
FIG. 3B illustrates an example fan assembly including an anti-rotation device in a locked position, according to one or more example embodiments.

FIG. 3B is a photograph of the fan assembly with the anti-rotation device in a locked position, according to one or more example embodiments. As shown in this figure, the free end of the long side of the substantially L-shaped lever 120 can be at least partially curved outwards. The substantially L-shaped lever can be made of a hard material such as metal, plastic, or fiber-reinforced composite. Similarly, the pulley and the substantially flat plate may be made of a hard material such as metal, plastic, or fiber-reinforced composite.

Figure 4:
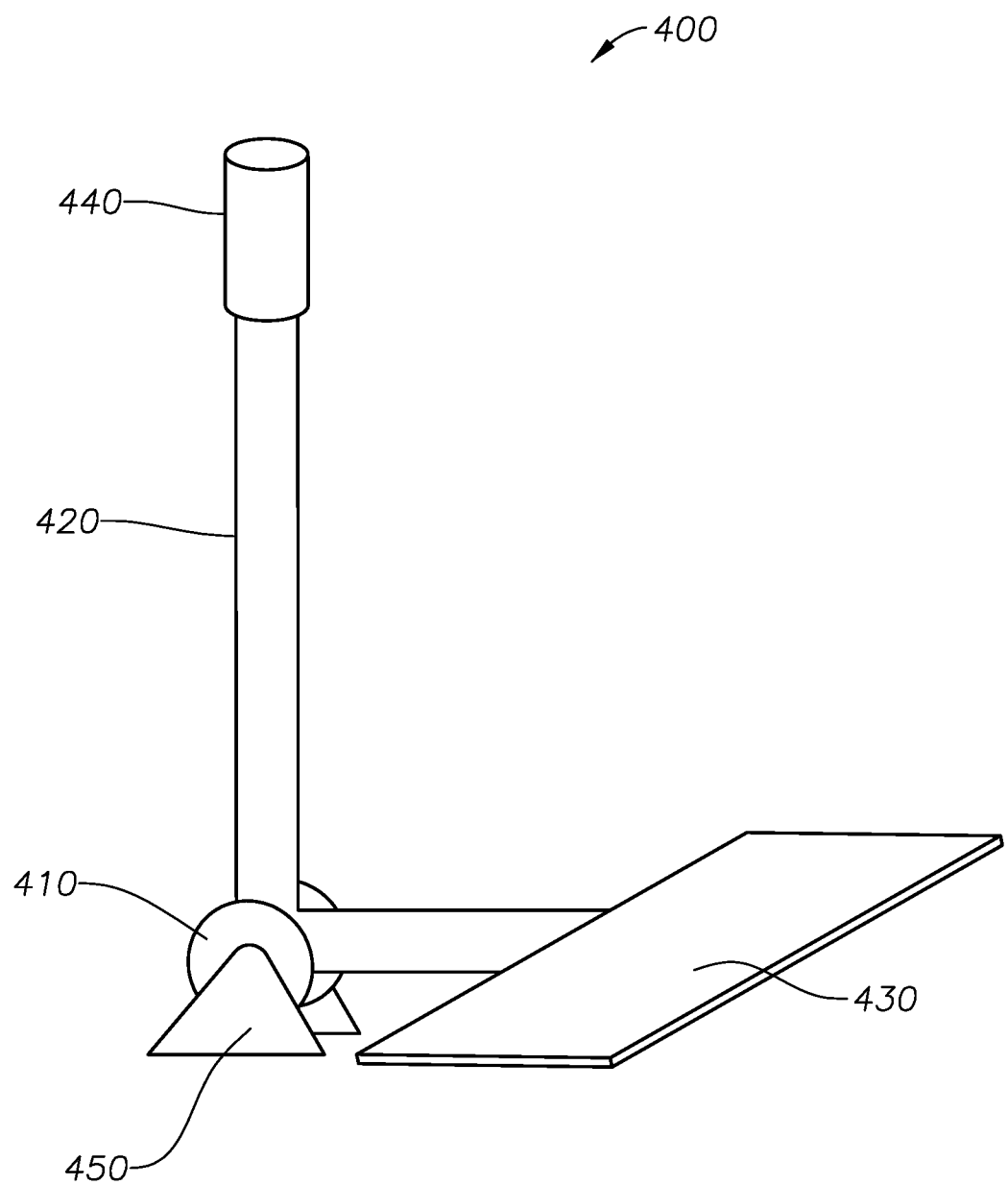
FIG. 4 illustrates a locked position of an anti-rotation device including a rubber or elastomeric tip, according to one or more example embodiments.

FIG. 4 illustrates a locked position of an anti-rotation device 400 including a rubber or elastomeric tip 440, according to one or more example embodiments. The aerodynamic anti-rotation device 400 includes a substantially L-shaped lever 420 having a long side and a short side. The device 400 also includes a pulley 410 operatively connected to the L-shaped lever 420 at a point where the long side and the short side meet. The device 400 also includes a substantially flat plate 430 attached to one end of the short side of the L-shaped lever 420. The pulley 410 includes a wheel on an axle or shaft configured to support movement of the L-shaped lever 420, and may be mounted using a bracket 450. In one embodiment, the substantially L-shaped lever 420 can be partially or fully coated with an elastomer or rubber. In this embodiment, the free end of the long side of the substantially L-shaped lever 420 includes a rubber or elastomeric tip 440.

Figure 5:
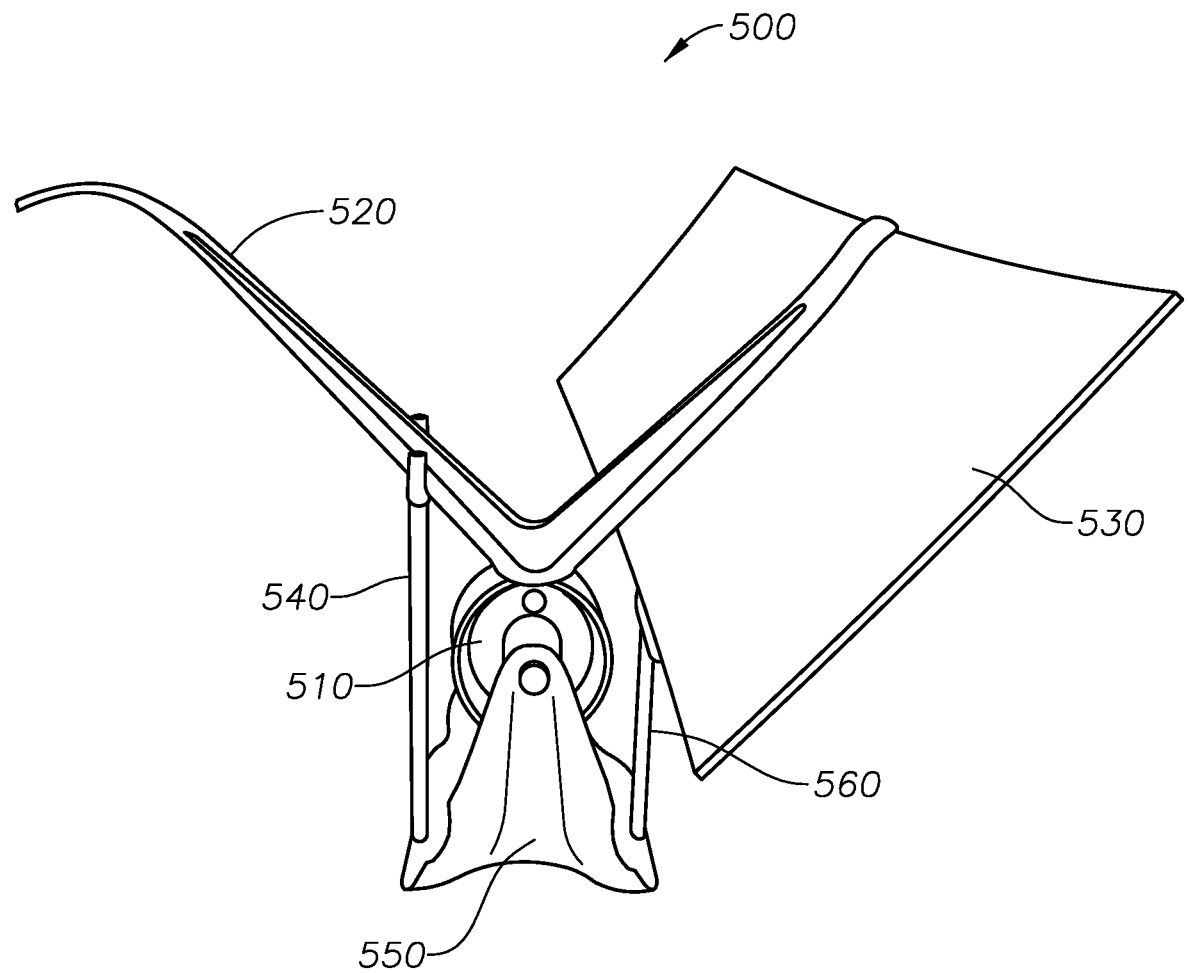
FIG. 5 illustrates an example anti-rotation device including swing stoppers, according to one or more example embodiments.

FIG. 5 is a photograph of an anti-rotation device 500 including swing stoppers 540, 560, according to one or more example embodiments. The aerodynamic anti-rotation device 500 includes a substantially L-shaped lever 520 having a long side and a short side. The device 500 also includes a pulley 510 operatively connected to the L-shaped lever 520 at a point where the long side and the short side meet. The device 500 also includes a substantially flat plate 530 attached to one end of the short side of the L-shaped lever 520. The pulley 510 includes a wheel on an axle or shaft configured to support movement of the L-shaped lever 520, and may be mounted using a bracket 550. According to this embodiment, the device 500 may include a first swing stopper 540 which may be configured to restrict movement of the substantially L-shaped lever 520. The device may also include a second swing stopper 560 that may be configured to restrict movement of the substantially flat plate 530.

One embodiment relates to industrial forced draft cooling fans including contactless aero dynamic anti-rotation pin instead of the conventional mechanical rotary anti rotation pin. All industrial plants have air cooled fans and all fans need a locking device to lock the fan from reverse rotation during off position. As a result, it requires mechanical anti rotation pin. However, all mechanical anti rotation pins in the market today are assembled with the fan shaft or gearbox. It is subject to rotation, wear, vibration and potential failures. Also, retrofitting is costly because it is part of the fan rotor and not independent.

An advantage of the aero dynamic anti-rotation pin is that when the fan starts, the pin utilizes airflow to dis-engage with the fan, and allow fan to rotate freely. When the fan stops, there is no airflow and the aero dynamic anti-rotation pin returns to lock position using gravity, which prevents the fan from reverse rotation. The aero dynamic anti-rotation pin is independent from the fan, and not part of the fan rotor. The absence of anti-rotation pin can cause coupling failures, gearbox failure, belt failures and motor failures.

Further modifications and alternative embodiments of various aspects of the disclosure will be apparent to those skilled in the art in view of this description. Accordingly, this description is to be construed as illustrative only and is for the purpose of teaching those skilled in the art the general manner of carrying out the embodiments. It is to be understood that the forms of the embodiments shown and described here are to be taken as examples of embodiments. Elements and materials may be substituted for those illustrated and described here, parts and processes may be reversed or omitted, and certain features of the embodiments may be utilized independently, all as would be apparent to one skilled in the art after having the benefit of this description of the embodiments. Changes may be made in the elements described here without departing from the spirit and scope of the embodiments as described in the following claims. Headings used here are for organizational purposes only and are not meant to be used to limit the scope of the description.

It will be appreciated that the processes and methods described here are example embodiments of processes and methods that may be employed in accordance with the techniques described here. The processes and methods may be modified to facilitate variations of their implementation and use. The order of the processes and methods and the operations provided may be changed, and various elements may be added, reordered, combined, omitted, modified, and so forth. Portions of the processes and methods may be implemented in software, hardware, or a combination of software and hardware. Some or all of the portions of the processes and methods may be implemented by one or more of the processors/modules/applications described here.

Although some embodiments refer to industrial fans, the anti-rotation device disclosed may be used in any fan including a central hub and a plurality of blades. Example of fans include those used in electronic devices, such as computer systems, laptops, desktop computers, and servers. Other examples include centrifugal fans, utility sets, mixed flow fans, inline fans, plug fans, plenum fans, wall exhausters, kitchen and restaurant exhaust fans, gravity relief ventilators, ceiling ventilators, propeller wall fans, axial fans, propeller roof ventilators, lab and fume exhaust fans, smote and heat exhaust fans, pressure blowers, radial bladed fans, man coolers, and air kits.

As used throughout this application, the word "may" is used in a permissive sense (meaning having the potential to), rather than the mandatory sense (meaning must). The words "include," "including," and "includes" mean including, but not limited to. As used throughout this application, the singular forms "a", "an," and "the" include plural referents unless the content clearly indicates otherwise. Thus, for example, reference to "an element" may include a combination of two or more elements. As used throughout this application, the term "or" is used in an inclusive sense, unless indicated otherwise. That is, a description of an element including A or B may refer to the element including one or both of A and B. As used throughout this application, the phrase "based on" does not limit the associated operation to being solely based on a particular item. Thus, for example, processing "based on" data A may include processing based at least in part on data A and based at least in part on data B, unless the content clearly indicates otherwise. As used throughout this application, the term "from" does not limit the associated operation to being directly from. Thus, for example, receiving an item "from" an entity may include receiving an item directly from the entity or indirectly from the entity (for example, by way of an intermediary entity). Unless specifically stated otherwise, as apparent from the discussion, it is appreciated that throughout this specification discussions utilizing terms "processing," "computing," "calculating," "determining," refer to actions or processes of a specific apparatus, such as a special purpose computer or a similar special purpose electronic processing/computing device. In the context of this specification, a special purpose computer or a similar special purpose electronic processing/computing device is capable of manipulating or transforming signals, typically represented as physical, electronic or magnetic quantities within memories, registers, or other information storage devices, transmission devices, or display devices of the special purpose computer or similar special purpose electronic processing/computing device.

The Specification, which includes the Summary, Brief Description of the Drawings and the Detailed Description, and the appended Claims refer to particular features (including process or method steps) of the disclosure. Those of skill in the art understand that the disclosure includes all possible combinations and uses of particular features described in the Specification. Those of skill in the art understand that the disclosure is not limited to or by the description of embodiments given in the Specification.

Those of skill in the art also understand that the terminology used for describing particular embodiments does not limit the scope or breadth of the disclosure. In interpreting the Specification and appended Claims, all terms should be interpreted in the broadest possible manner consistent with the context of each term. All technical and scientific terms used in the Specification and appended Claims have the same meaning as commonly understood by one of ordinary skill in the art to which this disclosure belongs unless defined otherwise.

Conditional language, such as, among others, "can," "could," "might," or "may," unless specifically stated otherwise, or otherwise understood within the context as used, is generally intended to convey that certain implementations could include, while other implementations do not include, certain features, elements, and operations. Thus, such conditional language generally is not intended to imply that features, elements, and operations are in any way required for one or more implementations or that one or more implementations necessarily include logic for deciding, with or without user input or prompting, whether these features, elements, and operations are included or are to be performed in any particular implementation.

The systems and methods described here, therefore, are well adapted to carry out the objects and attain the ends and advantages mentioned, as well as others that are inherent. While example embodiments of the system and method have been given for purposes of disclosure, numerous changes exist in the details of procedures for accomplishing the desired results. These and other similar modifications may readily suggest themselves to those skilled in the art, and are intended to be encompassed within the spirit of the system and method disclosed here and the scope of the appended claims.

The invention claimed is:

1. An industrial fan assembly comprising:
a central hub having a first axis;
a plurality of blades operatively connected to and configured to rotate around the central hub; and
an anti-rotation device having a second axis, the second axis being perpendicular to the first axis, the anti-rotation device configured to prevent the plurality of blades from rotating in a reverse direction, the anti-rotation device comprising:
a substantially L-shaped lever having a long side and a short side;
a pulley operatively connected to the substantially L-shaped lever at a point where the long side and the short side meet, the pulley comprising a wheel on an axle or shaft configured to support a movement of the substantially L-shaped lever; and
a substantially flat plate attached to one end of the short side of the substantially L-shaped lever,
so that when the industrial fan assembly is OFF, airflow from the industrial fan assembly gradually stops and a weight of the substantially flat plate pulls the substantially flat plate downwards due to gravity to move the long side into a rotating path of the plurality of blades of the industrial fan assembly, interaction of the blades with the long side when the fan is rotated in the reverse direction biases the flat plate into contact against a surface on which the fan assembly is supported and that interferes with further movement of the flat plate and the long side thereby engaging the substantially L-shaped lever with the plurality of blades of the fan and locking a reverse movement of the plurality of blades, and
so that when the industrial fan assembly is ON, forward movement of the plurality of blades disengages the substantially L-shaped lever, and airflow is generated by the plurality of blades of the industrial fan assembly lifts the substantially flat plate upwards.

2. The industrial fan assembly according to claim 1, further comprising an electric motor or a transmission unit including a gearbox and belt operatively connected to the central hub for powering the plurality of blades, wherein the pulley is oriented so that the short side extends from an end of the long side in a direction that is tangential to a rotational direction of the central hub.

3. The industrial fan assembly according to claim 1, wherein the weight of the substantially L-shaped lever is proportional to an airflow of the industrial fan assembly in cubic feet per minute.

4. The industrial fan assembly according to claim 1, wherein the weight of the substantially flat plate is proportional to an airflow of the industrial fan assembly in cubic feet per minute.

5. The industrial fan assembly according to claim 1, wherein a dimension of the substantially L-shaped lever is proportionally based on a size of the industrial fan assembly.

6. The industrial fan assembly according to claim 1, wherein a dimension of the substantially flat plate is proportionally based on a size of the industrial fan assembly.

7. The industrial fan assembly according to claim 1, wherein the substantially L-shaped lever is at least partially coated with an elastomer or rubber.

* * * * *